US008873616B2

(12) United States Patent
Garbutt et al.

(10) Patent No.: US 8,873,616 B2
(45) Date of Patent: Oct. 28, 2014

(54) HIGH RESOLUTION PULSE WIDTH MODULATOR

(71) Applicant: Microchip Technology Incorporated, Chandler, AZ (US)

(72) Inventors: Michael Garbutt, Durham, NC (US); Jacobus Albertus van Eeden, Chandler, AZ (US); David Martin, Methuen, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 71 days.

(21) Appl. No.: 13/773,177

(22) Filed: Feb. 21, 2013

(65) Prior Publication Data
US 2013/0223508 A1    Aug. 29, 2013

Related U.S. Application Data

(60) Provisional application No. 61/602,528, filed on Feb. 23, 2012.

(51) Int. Cl.
*H03K 7/08* (2006.01)
*H04L 25/49* (2006.01)

(52) U.S. Cl.
CPC .............. *H04L 25/4902* (2013.01); *H03K 7/08* (2013.01)
USPC ............ 375/238; 375/237; 375/239; 327/31; 327/172; 370/205; 370/212

(58) Field of Classification Search
CPC ............................ H04L 25/4902; H03K 7/08
USPC .................. 375/238, 237, 239; 327/31, 172; 370/205, 212
See application file for complete search history.

(56) References Cited

U.S. PATENT DOCUMENTS

| | | | | |
|---|---|---|---|---|
| 5,144,265 A * | 9/1992 | Petzold | ......................... | 332/109 |
| 7,495,565 B2 * | 2/2009 | Oakes et al. | ............... | 340/572.6 |
| 7,570,037 B2 * | 8/2009 | Li et al. | ......................... | 323/283 |
| 8,558,497 B2 * | 10/2013 | Wright | ......................... | 318/599 |
| 2004/0120395 A1 * | 6/2004 | Orr et al. | ...................... | 375/237 |
| 2005/0146366 A1 * | 7/2005 | Steinschaden | ............... | 327/175 |
| 2005/0212501 A1 * | 9/2005 | Acatrinei | ...................... | 323/283 |
| 2006/0164142 A1 | 7/2006 | Stanley | ......................... | 327/172 |
| 2007/0195876 A1 | 8/2007 | Prodic | ......................... | 375/238 |

(Continued)

OTHER PUBLICATIONS

International Search Report and Written Opinion, Application No. PCT/US2013/027216, 8 pages, Dec. 5, 2013.

(Continued)

*Primary Examiner* — Kenneth Lam
(74) *Attorney, Agent, or Firm* — King & Spalding L.L.P.

(57) ABSTRACT

A pulse width modulator has a first clock source providing a clock signal to a set input of an output controller configured to set a pulse width output signal and having a reset input to reset the pulse width output signal. A duty cycle control unit is coupled with the reset input of the output controller, wherein the duty cycle control unit has a numerical controlled oscillator (NCO) being coupled with a register and configured to provide for a direct digital synthesis to produce a specified frequency according to a value set in the register. Furthermore, logic is provided for receiving a signal from a second clock source and the pulse width output signal to trigger the numerical controlled oscillator.

20 Claims, 9 Drawing Sheets

(56) References Cited

U.S. PATENT DOCUMENTS

2010/0127789 A1    5/2010  Kenly et al. .................. 332/109
2010/0259179 A1*  10/2010  Bowling et al. ............... 315/224
2011/0193605 A1*   8/2011  Zhao ............................. 327/175

OTHER PUBLICATIONS

Van Eeden, Cobus, "AN1476: Combining the CLC and NCO to Implement a High Resolution PWM," Microchip Technology Incorporated, 10 pages, Nov. 7, 2012, © 2012.

* cited by examiner

HIGH RESOLUTION PULSE WIDTH MODULATOR

CROSS-REFERENCE TO RELATED APPLICATIONS

This application claims the benefit of U.S. Provisional Application No. 61/602,528 filed on Feb. 23, 2012, which is incorporated herein in its entirety.

TECHNICAL FIELD

The present disclosure relates to pulse width modulator, in particular, high resolution pulse width modulators.

BACKGROUND

Conventional pulse width modulators (PWM), for example a PWM unit in a microcontroller, are generally limited in their resolution to the general system clock. Resolution in PWM peripheral units is an important parameter, determining how accurately the pulse width can be controlled. If the PWM pulse width cannot be accurately enough controlled a number of problems such as limit cycling or simply an incorrect output voltage value will occur. As stated above, typically the smallest PWM pulse width adjustment would be equal to the system clock period. On a 16 MHz device this would be 62.5 ns.

In most switched mode power supply (SMPS) applications the operational range for duty cycle turns out being only a fraction of the full range. For example, a 12V to 1.2V DC/DC buck converter would use less than 10% of the full range, reducing the effective PWM resolution by 3.3 bits. This all means that a conventional PWM used for an SMPS at 600 kHz switching frequency operating from a 16 MHz system clock would at best be able to achieve 5 bits of resolution and if it was a DC/DC converter as described above it would lose 3.3 bits of resolution, resulting in an effective control resolution of a mere 1.7 bits which is clearly undesirable.

Hence, there exists a need for an improved PWM having a high resolution.

SUMMARY

According to an embodiment, a pulse width modulator may comprise a first clock source providing a clock signal to a set input of an output controller configured to set a pulse width output signal and having a reset input to reset the pulse width output signal; a duty cycle control unit coupled with the reset input of the output controller, wherein the duty cycle control unit comprises a numerical controlled oscillator (NCO) being coupled with a register and configured to provide for a direct digital synthesis to produce a specified frequency according to a value set in the register and further comprising logic receiving a signal from a second clock source and said pulse width output signal to trigger said numerical controlled oscillator.

According to a further embodiment, the NCO may generate an output signal with an averaged fixed duty cycle over a period of time. According to a further embodiment, the first clock source can be a timer, a PWM unit, an external source providing a regularly timed signal or an irregularly timed signal. According to a further embodiment, the second clock source can be a system clock source, a timer, a PWM unit, an external source. According to a further embodiment, the numerical controlled oscillator (NCO) may comprise a clock input receiving a signal derived from the second clock source, an increment register coupled with an adder configured to add the value of the increment register with a content of an accumulator, wherein the accumulator generates an overflow signal used as the output signal of the NCO. According to a further embodiment, the overflow signal can be ANDed with the signal derived from the second clock source to generate the output signal of the NCO. According to a further embodiment, the ANDed output signal can be fed to a clock input of a D-Flip-Flop whose inverted output is coupled with the D-input and whose non-inverted output provides the NCO output signal. According to a further embodiment, the NCO may comprise an input multiplexer for selecting a plurality of input signals, wherein one of the input signals is said signal derived from the second clock source. According to a further embodiment, the output controller can be a D-Flip-Flop comprising a clock input coupled with the first clock source, a D-input coupled with logic high, a reset input coupled with the output of the duty cycle control unit and a non-inverting output providing the output signal of the output controller. According to a further embodiment, the configurable logic cell may comprise a first AND gate having a first input coupled with the second clock source and a second input coupled with the output of the output controller, a second AND gate having a first input coupled with the second clock source and a second input receiving the NCO output signal, and an OR gate coupled with outputs of the first and second AND gates and generating the NCO input signal.

According to another embodiment, a microcontroller may comprise the pulse width modulator as described above, wherein the output controller is formed by a first configurable logic cell in said microcontroller and the logic within said duty cycle control unit is formed by a second configurable logic cell in said microcontroller.

According to a further embodiment of the microcontroller, the first configurable logic cell can be configured as a D-flip flop and the logic within said duty cycle control unit is configured as two AND gates whose outputs are coupled with the input of an OR gate. According to a further embodiment of the microcontroller, a clock input of the D-flip flop can be coupled with the first clock source and a clear input is coupled with the output of the NCO. According to a further embodiment of the microcontroller, the first input of the first AND gate can be coupled with the output of the D-flip flop, the second input of the first AND gate and the first input of the second AND gate are coupled with the second clock source, the second input of the second AND gate is coupled with the output of the NCO, and the output of the OR gate is coupled with the input of the NCO.

According to yet another embodiment, a method for providing a pulse width modulated signal may comprise the steps: providing a first clock signal to a set input of an output controller configured to set a pulse width output signal and having a reset input to reset the pulse width output signal; and generating a reset signal by a numerical controlled oscillator (NCO) being coupled with a register and configured to provide for a direct digital synthesis to produce a specified frequency according to a value set in the register wherein the NCO receives a clock signal derived from a second clock signal, the reset signal and pulse width modulated output signal.

According to a further embodiment of the method, the NCO may generate an output signal with an averaged fixed duty cycle over a period of time. According to a further embodiment of the method, the first clock signal can be generated by a timer, a PWM unit, an external source providing a regularly timed signal or an irregularly timed signal. According to a further embodiment of the method, the second clock signal can be generated by a system clock source, a timer, a PWM unit, or an external source. According to a further embodiment of the method, the numerical controlled oscillator (NCO) under control of the signal derived from the second clock source, may repeatedly add an increment value to an accumulator, wherein the accumulator generates an overflow signal used to generate the output signal of the NCO. According to a further embodiment of the method, the second clock signal can be ANDed with the pulse width modulated output signal and ORed with the second clock signal ANDed with the output signal of the NCO, and wherein the ORed signal is the signal derived from the second clock signal fed to the NCO.

DETAILED DESCRIPTION

Figure 1:
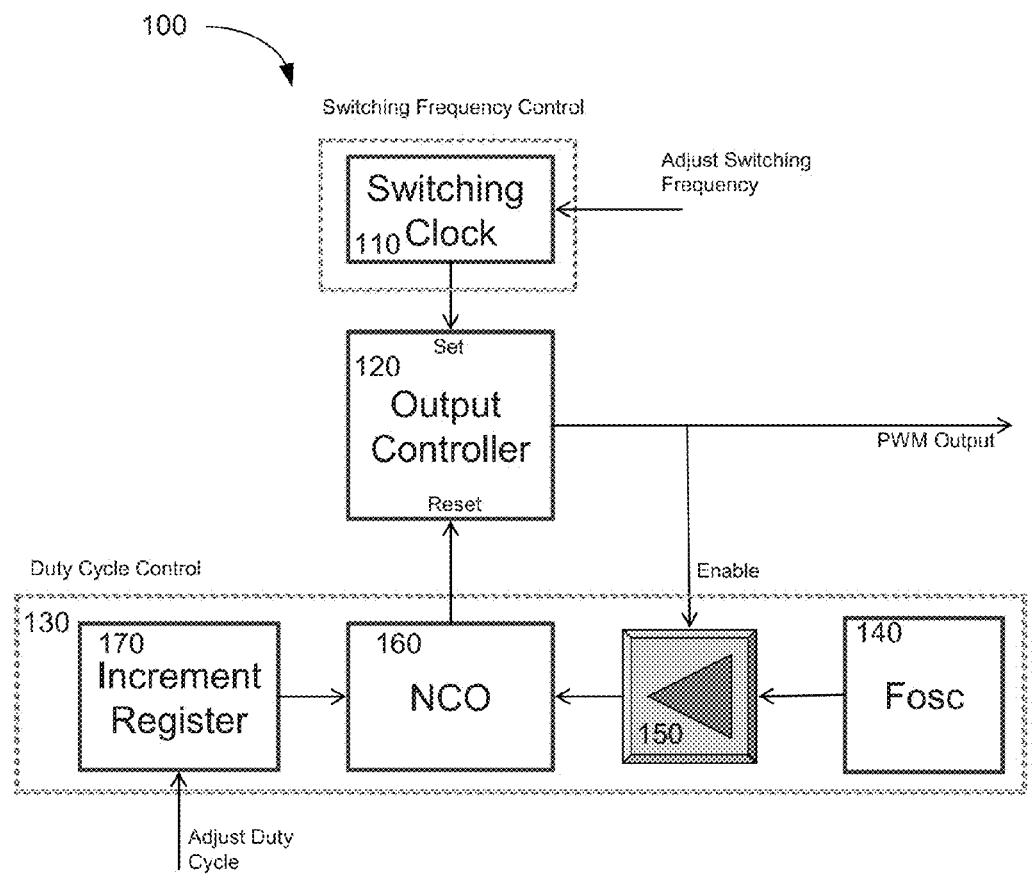
FIG. 1 shows a block diagram according to an embodiment.

In attempting to increase PWM resolution the duty cycle timer accuracy has to be improved. Various approaches exist to achieve this. Switched mode power supplies (SMPS) and similar devices are however not that sensitive to the pulse width but rather the average pulse width as they operate by balancing the energy flow between the load and the source. This is a paradigm shift from conventional SMPS design. Conventional solutions requiring a PWM would be looking at the PWM peripherals available on the device. An established method of improving resolution is simply to increase of the clock frequency. Conventional solutions have therefore been merely focusing on increasing the clock to solve this problem.

By averaging the pulse widths an effective pulse width control much smaller than the system clock can be achieved according to various embodiments. This concept may be hard to accept. However, physical embodiments according to the present disclosure can demonstrate the improved results. Hence even with a 62.5 ns system clock in a digital design that is a hard limit to the accuracy by which signals can be controlled, a 15 ps pulse width adjustment can be achieved according to various embodiments as will be explained in more detail below.

SMPS operate fundamentally by controlling the average energy transfer to the load, in other words they inherently average the pulse width supplied. In many microcontrollers, for example microcontrollers manufactured by the assignee of the present disclosure, a numerical controlled oscillator (NCO) module is available. According to various embodiments, such a numerical controlled oscillator module (NCO) peripheral can be used to improve the PWM resolution. To this end, the NCO can be used with a technique called Direct Digital Synthesis to generate a frequency which is, on average, very finely adjustable by adding a precisely controlled dither to the generated output. The same technique (in fact the same peripheral) can be used to create a very finely adjustable pulse width (1/f) in this way.

Furthermore, various microcontrollers, in particular certain microcontrollers manufactured by the assignee of the present disclosure, also provide for configurable logic cells (CLC). According to various embodiments, by using such a CLC as glue logic, the existing NCO can be turned into a PWM with an average pulse width increment of as small as 15 ps (Pico seconds) on a device running at a 16 MHz clock with current hardware. This will yield an effective PWM resolution of 17 bits for the same scenario as described above using the exact same 16 MHz clock on the same device.

A consumer of this signal averages the pulse width produced over time precisely as it is the case with an SMPS. For the NCO the consumer has to average the frequency. As a welcome side effect the jitter used to generate an average pulse width will effectively spread the switching frequency harmonics slightly and thus improve electromagnetic compatibility (EMC) performance of the device.

A software method to increase PWM switching frequency resolution was published by Microchip in 2006 as Application Note 1050. The focus was to increase the frequency resolution of the PWM by using an overflow counter.

The various embodiments proposed in this disclosure do not improve the frequency resolution, but increases the pulse width control resolution by using a similar technique. By combining both methods it can be made possible to control both the switching frequency and the pulse width accurately.

Furthermore the various embodiments proposed in this disclosure implement the technique in hardware in a simple and effective way. According to an embodiment, a DDS generated clock can be used to generate an extremely high resolution PWM with average pulse widths adjustable in increments down to pico seconds. The various embodiments can be implemented on existing hardware by combining the CLC and the NCO peripherals. It will be used for the control of SMPS power supply applications.

According to various embodiments, by using the properties of the NCO peripheral a high resolution PWM signal can be produced.

As shown in FIG. 1 according to an embodiment, a control circuit 100 is depicted comprising a switching clock 110 which is used to provide the time base or switching frequency for the PWM signal. This time base 110 can be a timer on the microcontroller, a PWM on the microcontroller, an external regularly timed signal or a irregular signal such as a zero current detect input or zero voltage detect input. According to various embodiments, the switching clock 110 may be adjustable, for example, by means of a digital control signal. The output controller 120 can be configured to set and reset a PWM output signal, thus controlling the pulse width. Thus, the switching clock 110 which as stated above may be adjustable determines the PWM switching frequency. The various embodiments can also be used to produce a single pulse (not a regular PWM signal but a monostable (one-shot) pulse of specified duration.

The second major functional component is the duty cycle control 130 as shown in FIG. 1. The duty cycle control 130 uses a clock source 140, which can be an oscillator clock, an internal regularly timed signal such as a timer or another PWM or an external signal provided through a microcontroller pin. This clock source 140 is connected through some logic gates 150 to the numerical controlled oscillator (NCO) peripheral 160 on the microcontroller. The NCO peripheral 160 is an overflow counter that implements Direct Digital Synthesis to produce a specified frequency by implementing an overflow counter which maintains the carry value in the accumulator. The increment register 170 is used to determine the switching frequency. The frequency produced by the NCO 160 is on average what has been set up in the increment register 170, this is achieved by occasionally emitting a pulse which is one clock faster than the normal pulse due to the carry in the accumulator causing an early overflow. The effect of this variation is that a higher average frequency is emitted. By using this frequency to count out the pulse width the frequency (1/f=T) is effectively inverted to implement an accurately controllable average pulse width on the PWM.

The output controller 120 combines the switching signal from switching clock 110 and the duty cycle controller 130 together starting the duty cycle controller clock only when the Switching Frequency Control has signaled a period start and disabling the duty cycle controller clock once the duty cycle pulse has been completed, leaving the system ready to receive the next Switching Frequency Control pulse and repeat the process.

Figure 2:
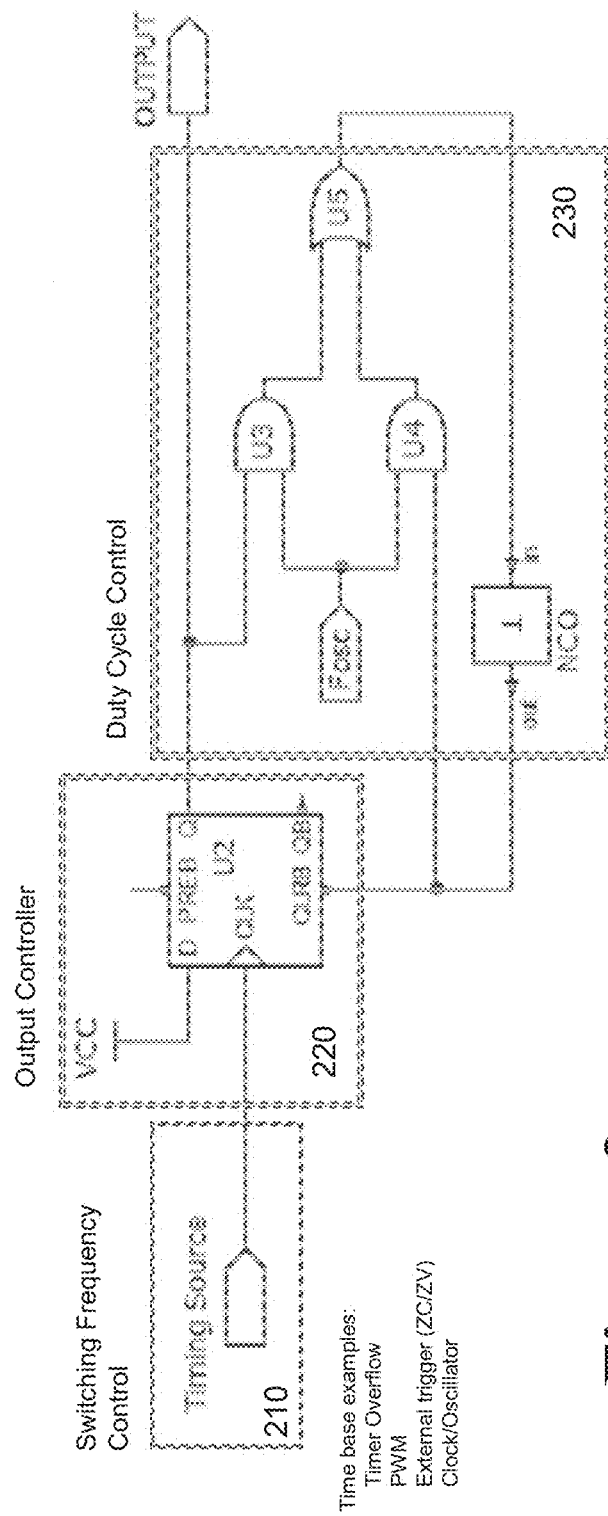
FIG. 2 shows an embodiment using an NCO peripheral and a CLC peripheral on a microcontroller.

FIG. 2 shows an actual exemplary implementation using a microcontroller with at least two configurable logic cells and an NCO. Such a microcontroller is available from the assignee of the present application, for example the PIC16F1509 manufactured by Microchip Technology Inc., the documentation of which is hereby incorporated by reference. The first logic cell 220 is configured to form a D-flip flop U2 of the output controller 120. The second logic cell 230 is configured to form two AND gates U3, U4 and an OR gate U5. Input and output signals are then programmably routed to form the circuit as shown in FIG. 2. However, according to other embodiments, dedicated logic can be implemented in a microcontroller that provides the same functionality.

The operation of the circuit can be described as follows: 1. The flip-flop U2 will clock on the positive edge of the timing signal. This will cause the Q output to go high and the PWM pulse to start. 2. As the output goes high, the AND gate U3 combines this output signal with a high-speed clock which is fed into the NCO clock pin via U5. At this point, the NCO output is low and U4 is not producing any output. 3. When the NCO overflows, the NCO output goes high, which resets the flip-flop, forcing the Q output of the flip-flop to go low. U3 is now inactive due one of the two inputs of the gate being low. 4. U4 is used to get the NCO back to a stable state, as it needs an additional clock to return the NCO output to low. Once the NCO output returns to low, U4 will also produce no clock output and the system will be in a stable state with the output low. 5. When the next positive edge from the timing source is received the process is repeated from step 1 above. The amount of time it takes the NCO to overflow will depend on the remainder left in the accumulator after the last overflow, as well as the increment register. Due to the accumulation of remainders the pulse will sometimes be one system clock shorter than usual. By controlling how often this happens (setting the increment register), the average pulse width can be exactly controlled.

Figure 4:
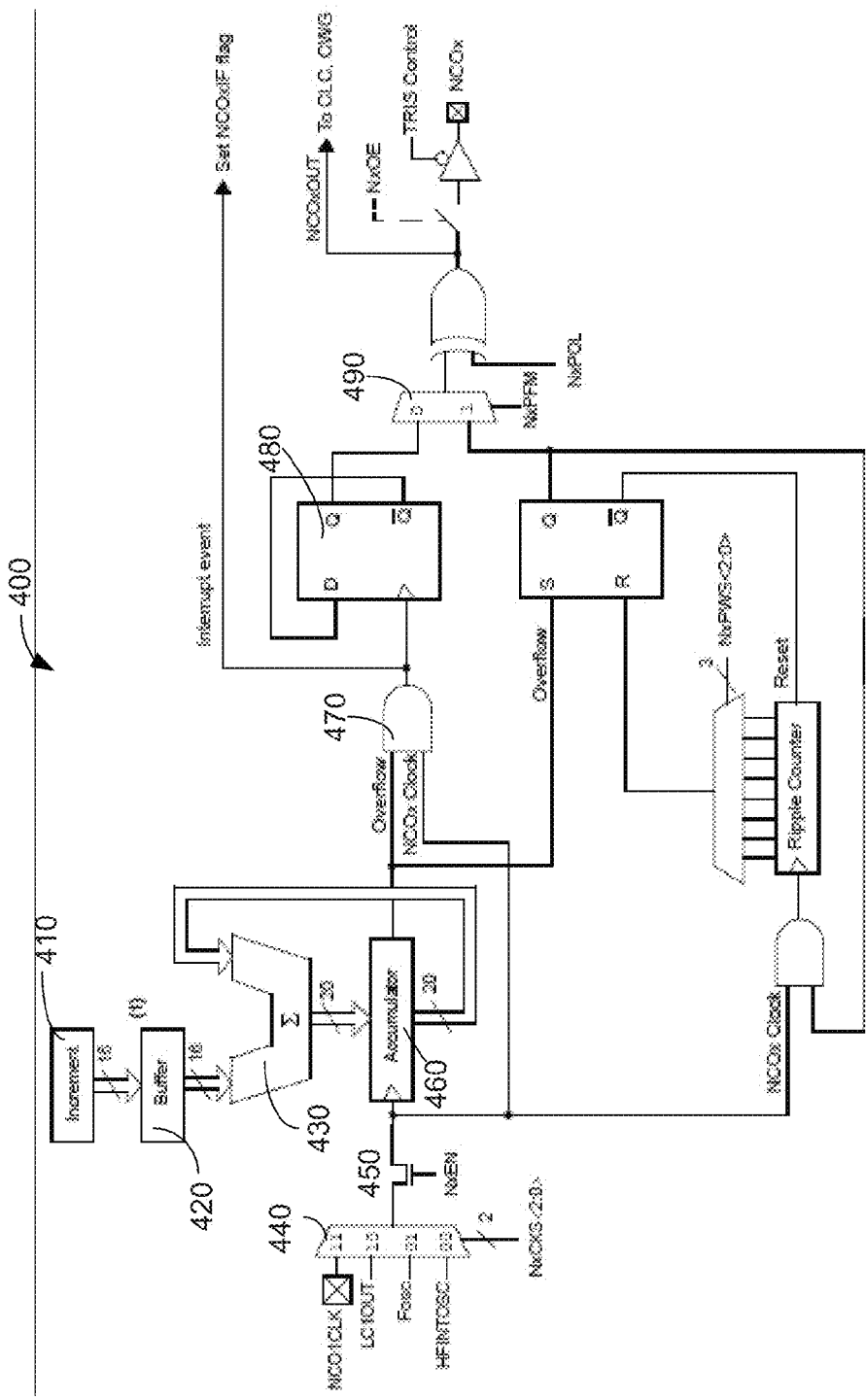
FIG. 4 shows a possible implementation of a numerical controlled oscillator (NCO) peripheral.

FIG. 4 shows an exemplary numerical controlled oscillator that can be implemented as peripheral device within a microcontroller. The Numerically Controlled Oscillator (NCO) module 400 is a timer that uses the overflow from the addition of an increment value to divide the input frequency. The advantage of the addition method over simple counter driven timer is that the resolution of division does not vary with the divider value. The NCO 400 is most useful for applications that require frequency accuracy and fine resolution at a fixed duty cycle. Features of the NCO include: 16-bit increment function, Fixed Duty Cycle (FDC) mode, Pulse Frequency (PF) mode, Output pulse width control, Multiple clock input sources, Output polarity control, and Interrupt capability.

The NCO module operates in a fixed duty cucle operation mode by repeatedly adding a fixed value stored in a register/buffer 410/420 to an accumulator 460 by means of an adder 430. Additions occur at the input clock rate provided by a multiplexer 440 and an enable gate 450. The accumulator 460 will overflow with a carry periodically, which is the raw NCO output signal. This output can be ANDed with the input clock by means of an AND gate 470 to generate an output signal, for example an interrupt signal NCOxIF. This signal can further be routed through other logic 480 as shown in FIG. 4 and fed to a multiplexer 490 to generate a final output signal NCOx-OUT which is used as the output signal of the numerical controlled oscillator. Multiplexer 490 is used to select a pulse frequency modulation mode using the logic shown in the lower part of FIG. 4 which is not relevant for the present embodiments.

According to the functionality of the NCO when operating in fixed duty cycle mode, the input clock is reduced by the ratio of the addition value to the maximum accumulator value:

$$F_{overflow} = (NCO\ clock\ frequency * Increment\ Value)/2^n,$$

wherein n is the accumulator width in bits.

The NCO output can be further modified by the additional logic by stretching the pulse or toggling a flip-flop. The modified NCO output can then be distributed internally to other peripherals and optionally output to a pin. The accumulator overflow also generates an interrupt. The NCOx period changes in discrete steps to create an average frequency. This output depends on the ability of the receiving circuit to average the NCOx output to reduce uncertainty.

The accumulator 460 can be, for example, a 20-bit register. Read and write access to the accumulator 460 may be available through three registers. The NCO Adder 430 can be a full adder, which operates independently from the system clock. The addition of the previous result and the increment value replaces the accumulator value on the rising edge of each input clock.

The Increment value 410 can stored in two 8-bit registers 420 making up a 16-bit increment. Both of the registers can be readable and writeable. The Increment registers 410, 420 can be double-buffered to allow for value changes to be made without first disabling the NCO module 400. The buffer loads are immediate when the module is disabled. Writing to the increment register first is necessary because then the buffer 420 is loaded synchronously with the NCO operation after the write is executed on the Increment register 410.

In Fixed Duty Cycle (FDC) mode, every time the accumulator 460 overflows, the output is toggled. This provides a 50% duty cycle, provided that the increment value remains constant. A timing diagram can be seen in FIG. 5. The FDC mode is selected by clearing a respective control bit in the NCO control register.

Figure 5:
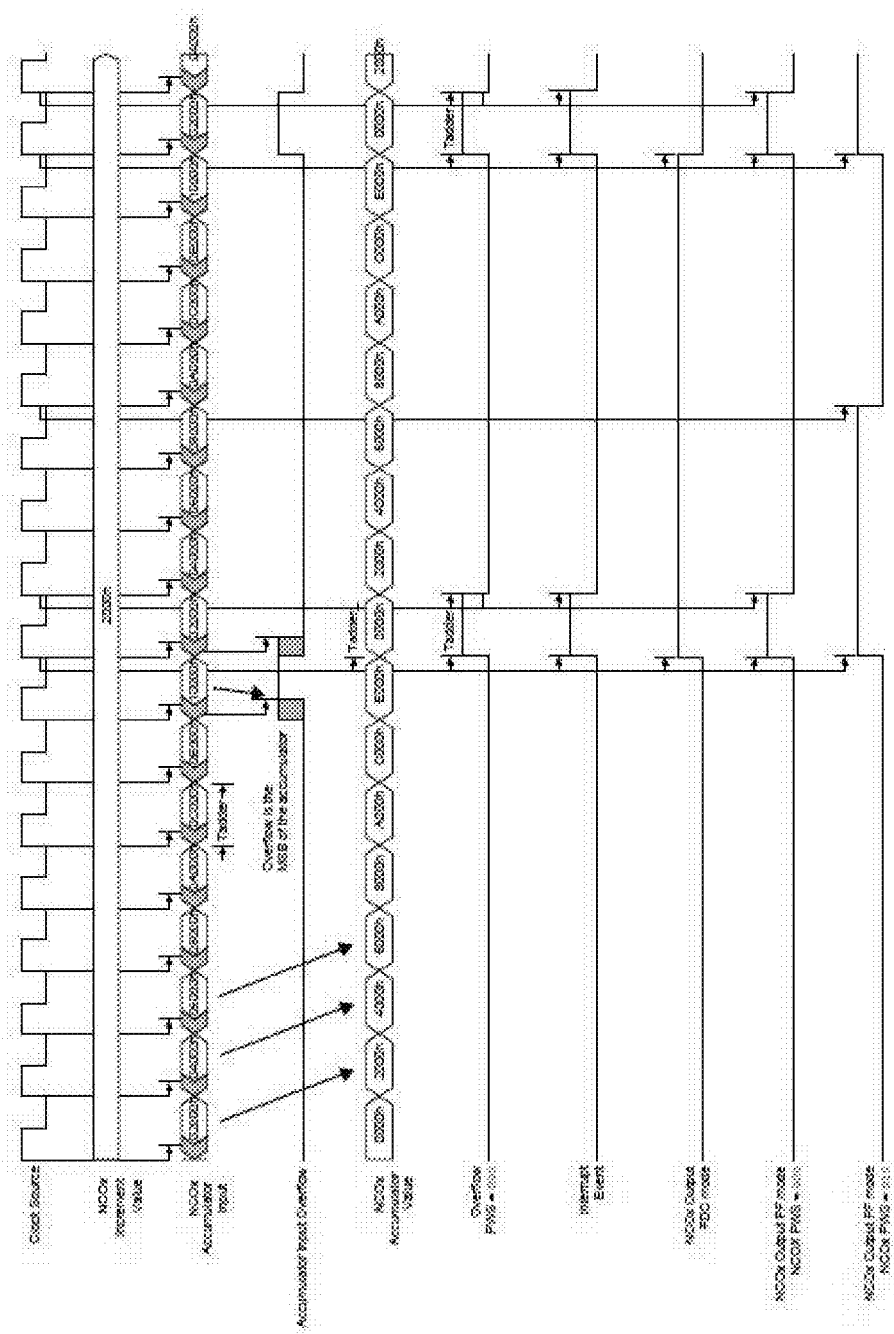
FIG. 5 shows timing diagrams of various signals of an NCO.

In Pulse Frequency (PF) mode, every time the accumulator 460 overflows, the output becomes active for one or more clock periods. Once the clock period expires, the output returns to an inactive state. This provides a pulsed output. The output becomes active on the rising clock edge immediately following the overflow event. Again, a timing diagram is shown in FIG. 5. The value of the active and inactive states depends on a polarity bit in the NCO control register. The PF mode is selected by setting a respective bit in the NCO control register.

When operating in PF mode, the active state of the output can vary in width by multiple clock periods. Various pulse widths are selected with respective bits in an NCO clock register. When the selected pulse width is greater than the accumulator overflow time frame, the output of the NCO operation is indeterminate.

The last stage in the NCO module is the output polarity. The NxPOL bit in the NCO control register selects the output polarity. Changing the polarity while the interrupts are enabled will cause an interrupt for the resulting output transition. The NCO output can be used internally by source code or other peripherals.

Figure 6:
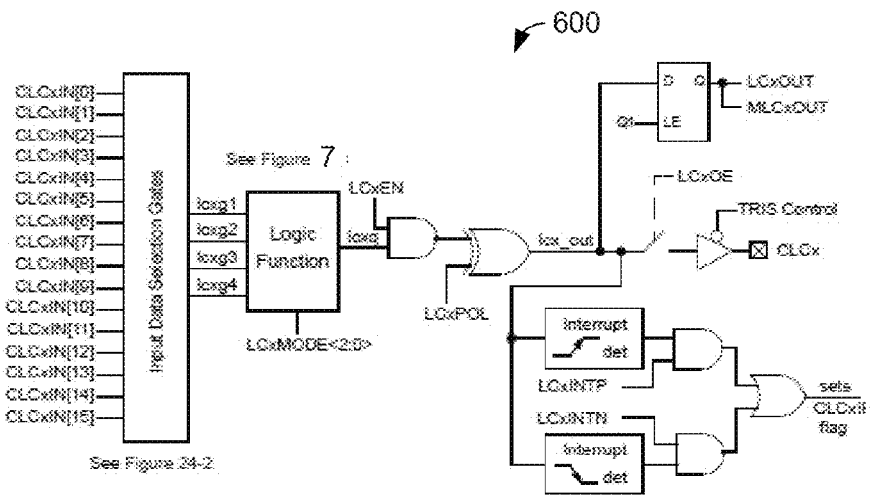
FIG. 6 shows a simplified block diagram of a configurable logic cell peripheral in a microcontroller.
Figure 7:
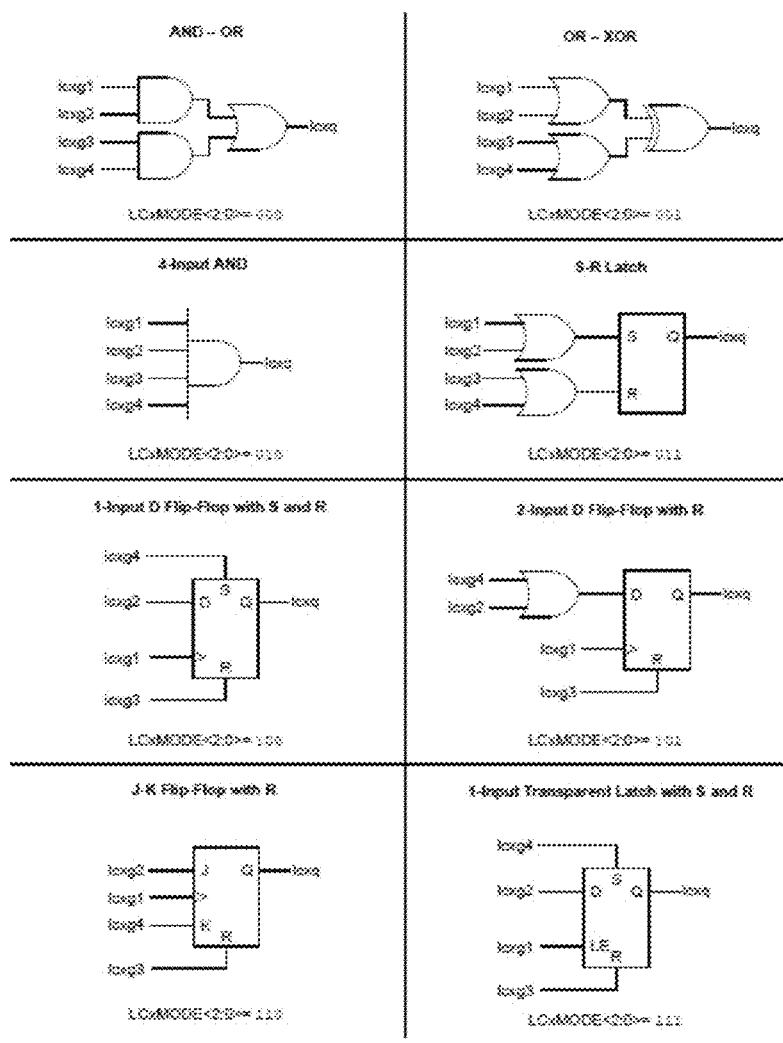
FIG. 7 shows possible logic cells that can be programmably selected within a microcontroller.

FIGS. 6 and 7 show examples of a programmable logic cell peripheral device according to various embodiments. However, as stated above, instead of programmable logic cells, dedicated logic can be implemented within a microcontroller to perform the same functions. The Configurable Logic Cell (CLCx) 600 provides programmable logic that operates outside the speed limitations of software execution. The logic cell receives up to 16 input signals and through the use of configurable input selection gates reduces the 16 inputs to four logic lines that drive one of, for example, eight selectable single-output logic functions. The input sources can be a combination of the following: I/O pins, Internal clocks, Peripherals, and Register bits. The output can be directed internally to peripherals and to an output pin. FIG. 6 shows for a simplified diagram showing signal flow through the CLCx, wherein x indicates a particular one of a plurality of configurable logic cells.

As shown in FIG. 7, possible configurations may include: Combinatorial Logic, such as AND, NAND, AND-OR, AND-OR-INVERT, OR-XOR, and OR-XNOR; and Latches such as S-R flip-flops, Clocked D-flip flops with Set and Reset, Transparent D-flip flops with Set and Reset, Clocked J-K flip flops with Reset. Programming the CLCx module 600 may be performed by configuring the 4 stages in the logic signal flow. The 4 stages are: Data selection, Data gating, Logic function selection, and Output polarity. Each stage can be setup at run time by writing to the corresponding CLCx Special Function Registers. This has the added advantage of permitting logic reconfiguration on-the-fly during program execution. There are 16 signals available as inputs to the configurable logic. Four 8-input multiplexers are used to select the inputs to pass on to the next stage. The 16 inputs to the multiplexers are arranged in groups of four. Each group is available to two of the four multiplexers, in each case, paired with a different group. This arrangement makes possible selection of up to two from a group without precluding a selection from another group. Data inputs are selected respective control registers. Data selection is through four multiplexers as indicated on the left side of FIG. 6. Data inputs in the figure are identified by a generic numbered input name.

Table 1 below shows the pulse width, which this circuit will produce using a 16 MHz clock connected directly to the NCO clock input (FNCO), given various increment register values. Note that, for high increment values, a single increment of the register will change the pulse width by a mere 15 ps.

TABLE 1

CALCULATED PWM PULSE WIDTH FOR DIFFERENT INCREMENT REGISTER VALUES

| Increment Value | NCO FOUT (Hz) | Average Pulse Width (ns) |
|---|---|---|
| 65000 | 991,821 | 1,008.246 |
| 65001 | 991,837 | 1,008.231 |
| 20000 | 305,176 | 3,276.800 |
| 20001 | 305,191 | 3,276.636 |
| 100 | 1,526 | 655,360.000 |
| 101 | 1,541 | 648,871.287 |

Figure 8B:
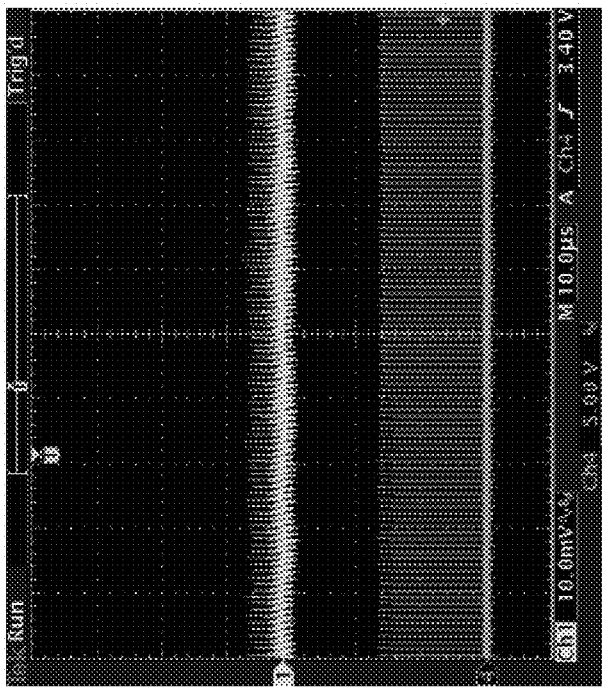
FIGS. 8A and 8B show timing diagrams of conventional PWM modulators and a PWM modulator according to various embodiments, respectively.
Figure 8A:
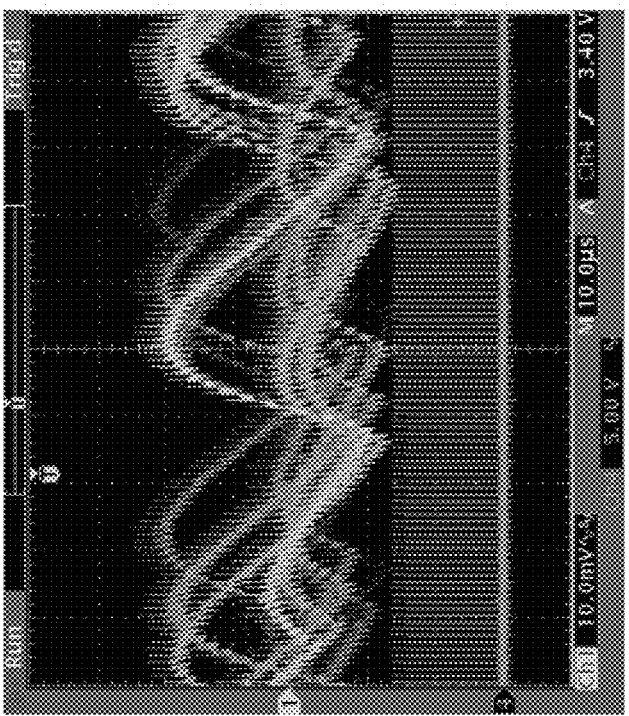

As shown in FIG. 8A, the ripple of a conventional PWM modulator used in an SMPS can be quite severe. FIG. 8B shows the output signal of an SMPS with a PWM configured according to various embodiments of the present disclosure. The NCO 160 can produce a finely adjustable average frequency with f=1/t resulting in a low ripple output voltage. The NCO 160 has thus a finely adjustable period. By averaging (dithering), the NCO period increments achievable are much smaller than the CPU clock and by using this period for the PWM pulse width the pulse width can be adjusted by increments effectively much smaller than the CPU clock.

Figure 3:
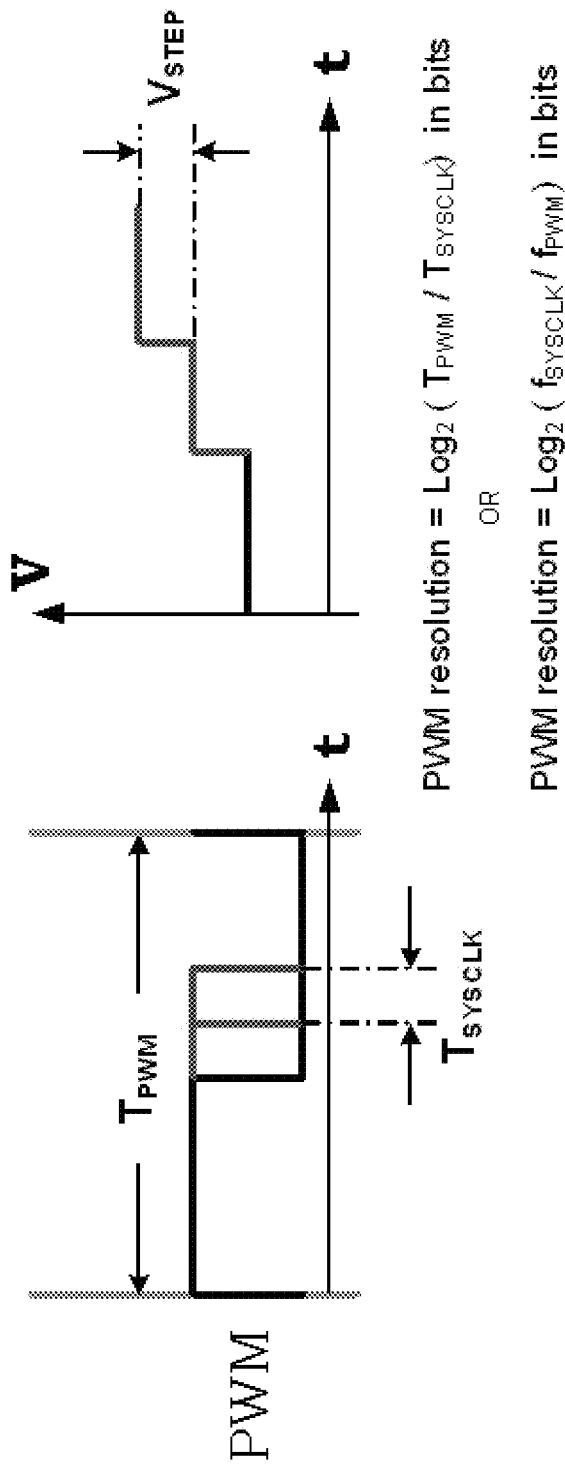
FIG. 3 shows the typical resolution of a conventional PWM unit.

Conventional PWM Pulse widths can only adjust by $T_{OSC}$ at a time as shown in FIG. 3. When a pulse width modulated signal is converted into a DC voltage, for example, by means of a low pass filter, FIG. 3 shows the resolution that can be achieved by such a conventional PWM modulator and FIG. 8A shows an actual oscilloscope signal recording of a conventional SMPS. As $T_{PWM}$ approaches $T_{OSC}$ the effective PWM resolution decreases. For example, with a 16 MHz clock, switching at 1 MHz results in: $T_{OSC}=T_{PWM}/16$. This again results in a PWM resolution over the full range of only 4 bits (16 possible values for pulse width). The operating point of the control loop typically occupies a small portion of the full range of the PWM.

Hence, a 16 MHz processor switching at 1 MHz can provide for a PWM with 4 bits of resolution (full range). If the operating point is around a 10% duty cycle then there is effectively only 1 bit of control range. This results in usable values of: 6.25%, 12.5%, and maybe at best also 18.75%. Typically there is only 1 bit of control, wherein a best case may provide for 1.58 bits: $Log_2(3)=1.58$. The overactive control loop thus will oscillate and can become unstable. Thus, a high speed control loop becomes a necessity.

Table 2 shows a comparison of a conventional PWM with the PWM according to various embodiments.

TABLE 2

|  | Conventional PWM | NCO Controlled PWM |
|---|---|---|
| Clock Frequency | 16 MHz | 16 MHz |
| Switching Frequency | 1 MHz | 1 MHz |
| Ripple (@50% duty cycle) | 12.5% | 0.003% |
| $V_{IN}$ | 10 V | 10 V |
| $V_{OUT}$ | 5 V | 5 V |
| $V_{RIPPLE}$ | 0.625 V | 152 uV |
| Best PWM Pulse Adjustment | 62.5 ns | 15.26 ps |
| Full Range PWM Resolution | 4 bits | 16 bits |
| 10% range PWM control Resolution | 1 bit | 13 bits |

The best conventional PWM's on the market have pulse widths adjustable by 150 ps wherein the pulse width of $T_{OSC}=150$ ps requires a frequency of 6.7 GHz. However, these devices are obviously very costly and require high power. On a 16 MHz device, according to various embodiments, a 15 ps resolution can be achieved using a numerical controlled oscillator (NCO) as clock source. Hence, a massive increase in the effective PWM resolution can be achieved which is very attractive for example, for SMPS applications. A conventional approach would require to increase the system clock to over 66 GHz to achieve the same result, which has huge cost, power and other practical implications.

Figure 9A:
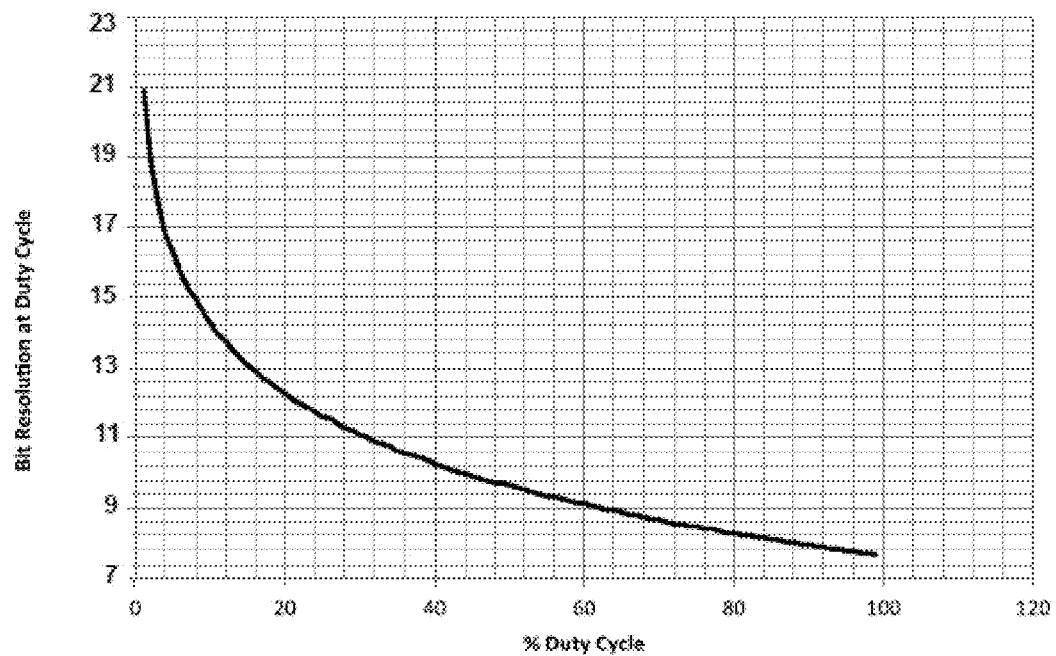
FIGS. 9A-D show bit resolution of a high resolution PWM plotted against the duty cycle of various configurations.

The NCO is designed to give linear control over frequency. The control over pulse width is subsequently not linear. The pulse width will vary with the inverse of the frequency (1/x). The result is that the effective resolution of the PWM is not constant over the entire range from 0% to 100% duty cycle. For every duty cycle setting, the effective resolution can be calculated at this particular point, and can be plotted on a graph. This curve will look different depending on what the switching frequency is, because the pulse width is adjusted independently from the switching frequency. For a FSW=3 kHz and a 16 MHz clock, the graph will look as shown in FIG. 9A. Although there is an equivalent 21 bits of resolution close to 0% duty cycle, this deteriorates to only 7.5 bits of resolution at 100% duty cycle, at which point the conventional PWM would outperform the High-Resolution implementation.

Figure 9B:
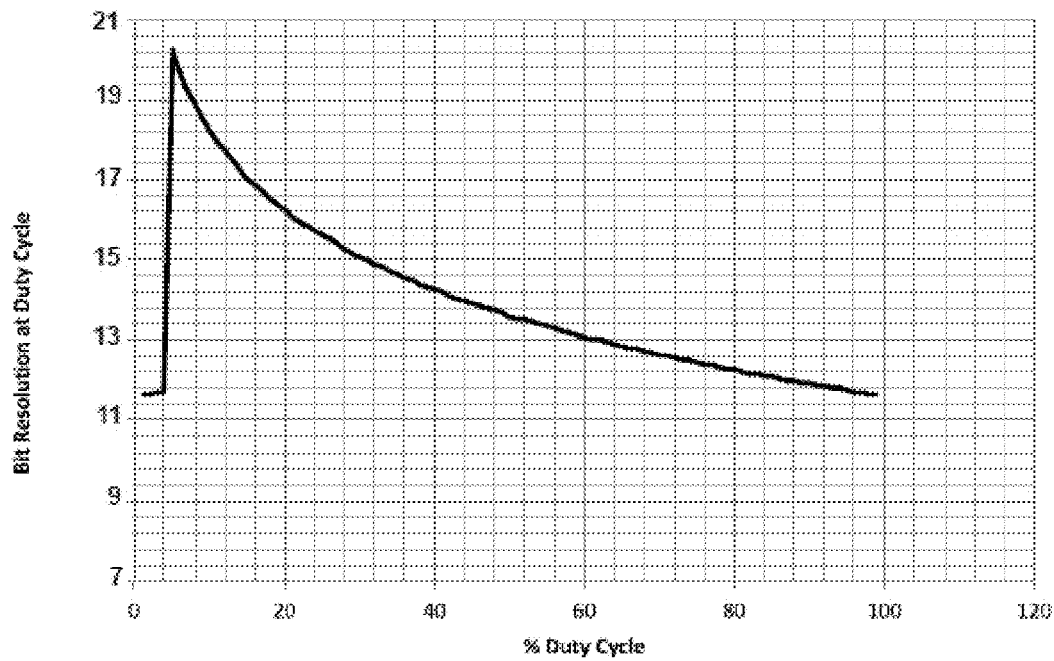

Interestingly, and perhaps counter-intuitively, the resolution can be improved by decreasing the NCO input clock frequency. Reducing this clock to 1 MHz will have the result shown in FIG. 9B. There is, of course, a limitation, as can be seen, close to 0% duty cycle, where the increment register maximum value is reached and smaller pulses cannot be generated any more, but the resolution now never reduces to less than 11 bits.

Figure 9C:
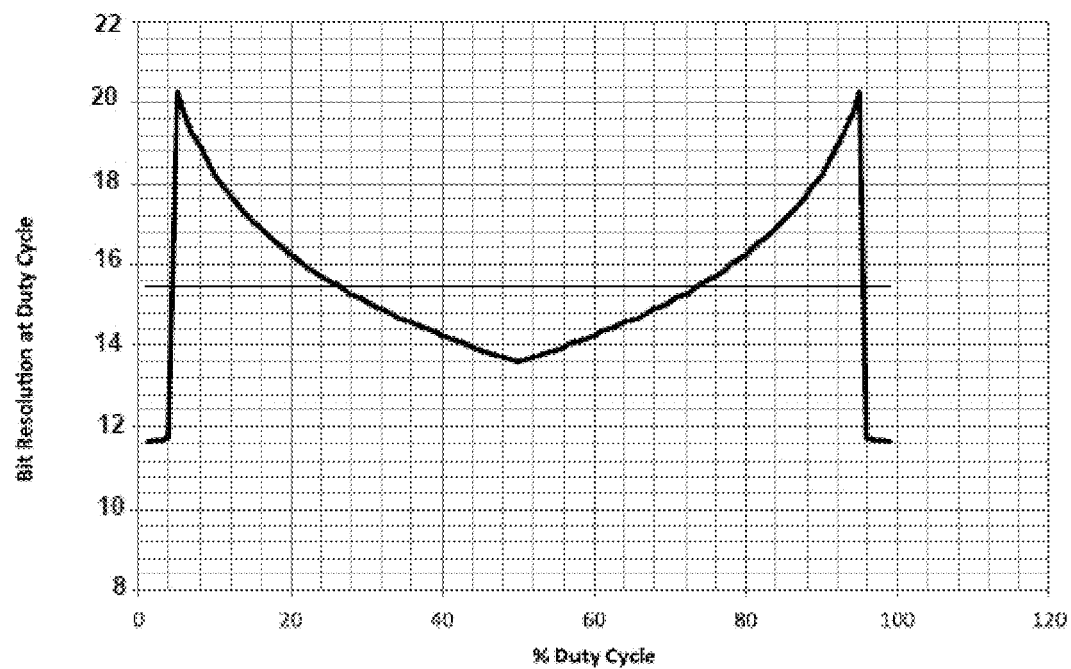

According to another embodiment, to improve the performance, the PWM signal can be inverted when the duty cycle exceeds 50%. By doing this the performance under 50% duty cycle is effectively mirrored to the region above it, with the higher resolution. There is still the option to use the original curve where the limits of the increment are reached. This results in the graph as depicted in FIG. 9C for the same conditions as the graph of FIG. 9B.

Figure 9D:
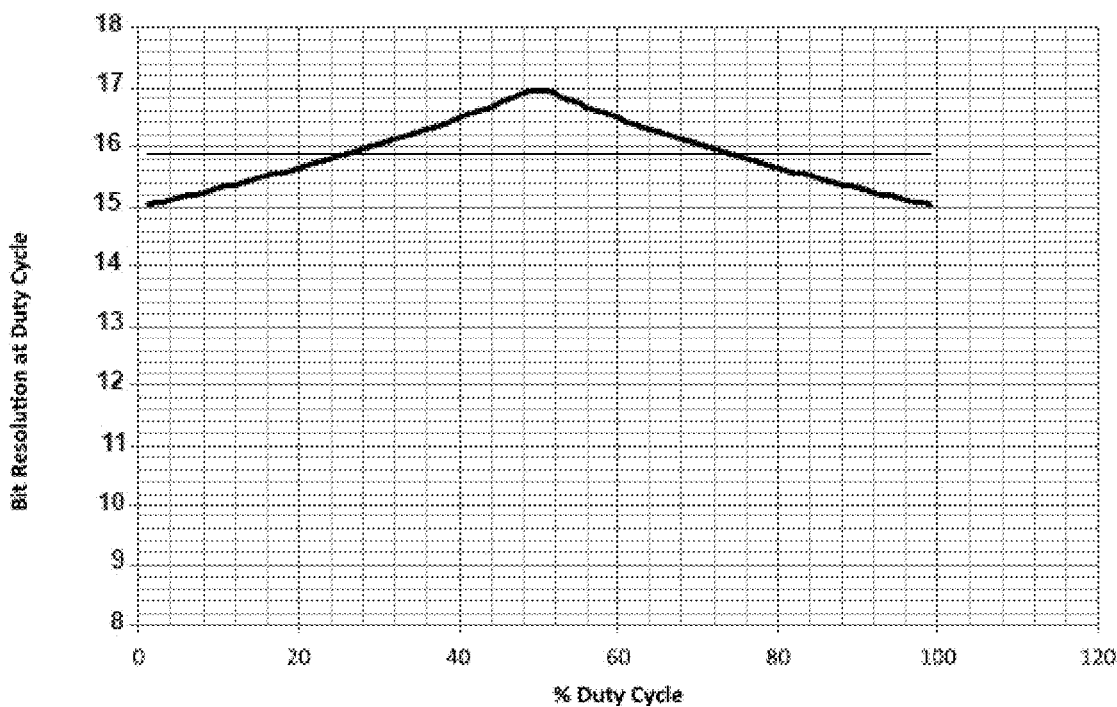

To achieve both the highest possible switching frequency, and the highest resolution using this technique, a configuration as shown in FIG. 9D can be used. This graph shows the achievable resolution when using a 16 MHz clock at a switching frequency of 500 kHz with inversion at 50%.

The PWM output according to various embodiments produces an average pulse width. Although this is perfect for SMPS applications some other applications of PWMs may not be able to accommodate this. Also, the pulse adjustment resolution decreases as the switching frequency is decreased.

The various embodiments can be implemented preferably in microcontrollers. As a side-effect the PWM can be triggered from an external signal such as a Zero current or Zero Voltage detector or comparator. This can be very important for efficiently switching FET's. A huge increase (4 bits to 16 bits) in PWM resolution with no increase in cost can thus be accomplished. For example, as mentioned above, a PIC16F1509 manufactured by the assignee, can be used to implement an embodiment according to this disclosure.

This present embodiments allow for highly accurate SMPS control loops at extremely low power running at a fraction of the clock speeds of conventional systems, and still performing multiple orders of magnitude better. Higher switching speeds mean higher power densities which in turn means physically smaller and less expensive power supplies. One of the factors in SMPS design limiting switching frequency is that the PWM resolution decreases as the switching frequency increases.

What is claimed is:
1. A pulse width modulator comprising:
a first clock source providing a clock signal to a set input of an output controller configured to set a pulse width output signal and having a reset input to reset the pulse width output signal;
a duty cycle control unit coupled with the reset input of the output controller, wherein the duty cycle control unit comprises a numerical controlled oscillator (NCO) being coupled with a register and configured to provide for a direct digital synthesis to produce a specified frequency according to a value set in the register and further comprising logic receiving a signal from a second clock source and said pulse width output signal to trigger said numerical controlled oscillator.

2. The pulse width modulator according to claim 1, wherein the NCO generates an output signal with an averaged fixed duty cycle over a period of time.

3. The pulse width modulator according to claim 1, wherein the first clock source is a timer, a PWM unit, an external source providing a regularly timed signal or an irregularly timed signal.

4. The pulse width modulator according to claim 1, wherein the second clock source is a system clock source, a timer, a PWM unit, an external source.

5. The pulse width modulator according to claim 1, wherein the numerical controlled oscillator (NCO) comprises a clock input receiving a signal derived from the second clock source, an increment register coupled with an adder configured to add the value of the increment register with a content of an accumulator, wherein the accumulator generates an overflow signal used as the output signal of the NCO.

6. The pulse width modulator according to claim 5, wherein the overflow signal is ANDed with the signal derived from the second clock source to generate the input signal of the NCO.

7. The microcontroller according to claim 6, wherein the first input of the first AND gate is coupled with the output of the D-flip flop, the second input of the first AND gate and the first input of the second AND gate are coupled with the second clock source, the second input of the second AND gate is coupled with the output of the NCO, and the output of the OR gate is coupled with the input of the NCO.

8. The pulse width modulator according to claim 5, wherein the ANDed output signal is fed to a clock input of a D-Flip-Flop whose inverted output is coupled with the D-input and whose non-inverted output provides the NCO output signal.

9. The pulse width modulator according to claim 5, wherein the NCO comprises an input multiplexer for selecting a plurality of input signals, wherein one of the input signals is said signal derived from the second clock source.

10. The microcontroller according to claim 5, wherein a clock input of the D-flip flop is coupled with the first clock source and a clear input is coupled with the output of the NCO.

11. The pulse width modulator according to claim 1, wherein the output controller is a D-Flip-Flop comprising a clock input coupled with the first clock source, a D-input coupled with logic high, a reset input coupled with the output of the duty cycle control unit and a non-inverting output providing the output signal of the output controller.

12. The pulse width modulator according to claim 11, wherein the configurable logic cell comprises a first AND gate having a first input coupled with the second clock source and a second input coupled with the output of the output controller, a second AND gate having a first input coupled with the second clock source and a second input receiving the NCO output signal, and an OR gate coupled with outputs of the first and second AND gates and generating the NCO input signal.

13. A microcontroller comprising the pulse width modulator according to claim 1, wherein the output controller is formed by a first configurable logic cell in said microcontroller and the logic within said duty cycle control unit is formed by a second configurable logic cell in said microcontroller.

14. The microcontroller according to claim 13, wherein the first configurable logic cell is configured as a D-flip flop and the logic within said duty cycle control unit is configured as two AND gates whose outputs are coupled with the input of an OR gate.

15. A method for providing a pulse width modulated signal comprising:
- a input providing a first clock signal to a set input of an output controller configured to set a pulse width output signal and having a reset input to reset the pulse width output signal;
- generating a reset signal by a numerical controlled oscillator (NCO) being coupled with a register and configured to provide for a direct digital synthesis to produce a specified frequency according to a value set in the register wherein the NCO receives a clock signal derived from a second clock signal, the reset signal and pulse width modulated output signal.

16. The method according to claim 15, wherein the NCO generates an output signal with an averaged fixed duty cycle over a period of time.

17. The method according to claim 15, wherein the first clock signal is generated by a timer, a PWM unit, an external source providing a regularly timed signal or an irregularly timed signal.

18. The method according to claim 15, wherein the second clock signal is generated by a system clock source, a timer, a PWM unit, or an external source.

19. The method according to claim 15, wherein the numerical controlled oscillator (NCO) under control of the signal derived from the second clock source, repeatedly adds an increment value to an accumulator, wherein the accumulator generates an overflow signal used to generate the output signal of the NCO.

20. The method according to claim 19, wherein the second clock signal is ANDed with the pulse width modulated output signal and ORed with the second clock signal ANDed with the output signal of the NCO, and wherein the ORed signal is the signal derived from the second clock signal fed to the NCO.

* * * * *